(12) United States Patent
Tanabe et al.

(10) Patent No.: US 9,941,145 B2
(45) Date of Patent: Apr. 10, 2018

(54) WAFER PROCESSING TEMPORARY BONDING ARRANGEMENT, WAFER PROCESSING LAMINATE, AND THIN WAFER MANUFACTURING METHOD

(71) Applicant: SHIN-ETSU CHEMICAL CO., LTD., Tokyo (JP)

(72) Inventors: Masahito Tanabe, Annaka (JP); Michihiro Sugo, Annaka (JP); Hiroyuki Yasuda, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/196,956

(22) Filed: Jun. 29, 2016

(65) Prior Publication Data

US 2017/0004989 A1    Jan. 5, 2017

(30) Foreign Application Priority Data

Jun. 30, 2015   (JP) .................................. 2015-131064

(51) Int. Cl.
*H01L 21/31*  (2006.01)
*H01L 21/683*  (2006.01)
(Continued)

(52) U.S. Cl.
CPC ............ *H01L 21/6835* (2013.01); *B32B 7/12* (2013.01); *B32B 9/04* (2013.01); *B32B 9/043* (2013.01); *B32B 9/045* (2013.01); *B32B 25/08* (2013.01); *B32B 25/20* (2013.01); *B32B 27/08* (2013.01); *B32B 27/325* (2013.01); *C09J 109/06* (2013.01); *C09J 183/04* (2013.01); *H01L 21/02013* (2013.01); *H01L 21/302* (2013.01); *B32B 2255/26* (2013.01); *B32B 2255/28* (2013.01); *B32B 2264/105* (2013.01); *B32B 2270/00* (2013.01); *B32B 2274/00* (2013.01); *B32B 2307/302* (2013.01); *B32B 2307/50* (2013.01); *B32B 2457/08* (2013.01); *B32B 2457/14* (2013.01); *C08G 77/12* (2013.01); *C08G 77/20* (2013.01);
(Continued)

(58) Field of Classification Search
CPC .............................. H01L 21/6835; B32B 7/12
USPC ........................................... 438/455; 428/172
See application file for complete search history.

(56) References Cited

U.S. PATENT DOCUMENTS 7,541,264 B2   6/2009   Gardner et al.
8,800,631 B2   8/2014   Noda et al.
(Continued)

FOREIGN PATENT DOCUMENTS

EP   1 550 156 A2   7/2005
EP   2 738 797 A3   6/2014
(Continued)

*Primary Examiner* — Caleb Henry
(74) *Attorney, Agent, or Firm* — Westerman, Hattori, Daniels & Adrian, LLP

(57) ABSTRACT

A temporary bonding arrangement for wafer processing is provided comprising a first temporary bond layer (A) of thermoplastic resin, a second temporary bond layer (B) of thermosetting siloxane polymer, and a third temporary bond layer (C) of thermosetting polymer. Layer (B) is cured with a curing catalyst contained in layer (A) which is laid contiguous to layer (B). An adhesive layer of uniform thickness is formed without insufficient step coverage and other failures.

11 Claims, 1 Drawing Sheet

(51) Int. Cl.
*C09J 183/04* (2006.01)
*H01L 21/302* (2006.01)
*C09J 109/06* (2006.01)
*H01L 21/02* (2006.01)
*B32B 7/12* (2006.01)
*B32B 9/04* (2006.01)
*B32B 25/08* (2006.01)
*B32B 25/20* (2006.01)
*B32B 27/08* (2006.01)
*B32B 27/32* (2006.01)
*C08G 77/12* (2006.01)
*C08G 77/20* (2006.01)

(52) U.S. Cl.
CPC ........... *H01L 2221/6834* (2013.01); *H01L 2221/68318* (2013.01); *H01L 2221/68327* (2013.01); *H01L 2221/68381* (2013.01); *H01L 2221/68386* (2013.01)

(56) References Cited

U.S. PATENT DOCUMENTS

| | | | |
|---|---|---|---|
| 9,263,333 B2 | 2/2016 | Sugo et al. | |
| 2004/0213994 A1* | 10/2004 | Kozakai | C09J 7/0246 428/354 |
| 2009/0133812 A1* | 5/2009 | Noda | B32B 43/006 156/153 |
| 2013/0108866 A1* | 5/2013 | Kato | C08G 77/52 428/354 |
| 2013/0220687 A1* | 8/2013 | Tagami | C09J 7/00 174/259 |
| 2013/0280886 A1* | 10/2013 | Kato | B32B 7/06 438/459 |
| 2014/0154868 A1* | 6/2014 | Sugo | H01L 21/6835 438/458 |
| 2016/0189996 A1* | 6/2016 | Tanabe | C09J 183/04 428/354 |
| 2016/0189998 A1* | 6/2016 | Yasuda | B24B 37/30 438/692 |
| 2016/0326414 A1* | 11/2016 | Tagami | C08L 83/04 |
| 2017/0004989 A1* | 1/2017 | Tanabe | C09J 109/06 |
| 2017/0053821 A1* | 2/2017 | Sugo | C09J 183/00 |
| 2017/0069521 A1* | 3/2017 | Sugo | B32B 27/08 |
| 2017/0110360 A1* | 4/2017 | Tagami | H01L 21/304 |

FOREIGN PATENT DOCUMENTS

| | | |
|---|---|---|
| JP | 2004-64040 A | 2/2004 |
| JP | 2006-328104 A | 12/2006 |
| JP | 2014-131004 A | 7/2014 |

* cited by examiner

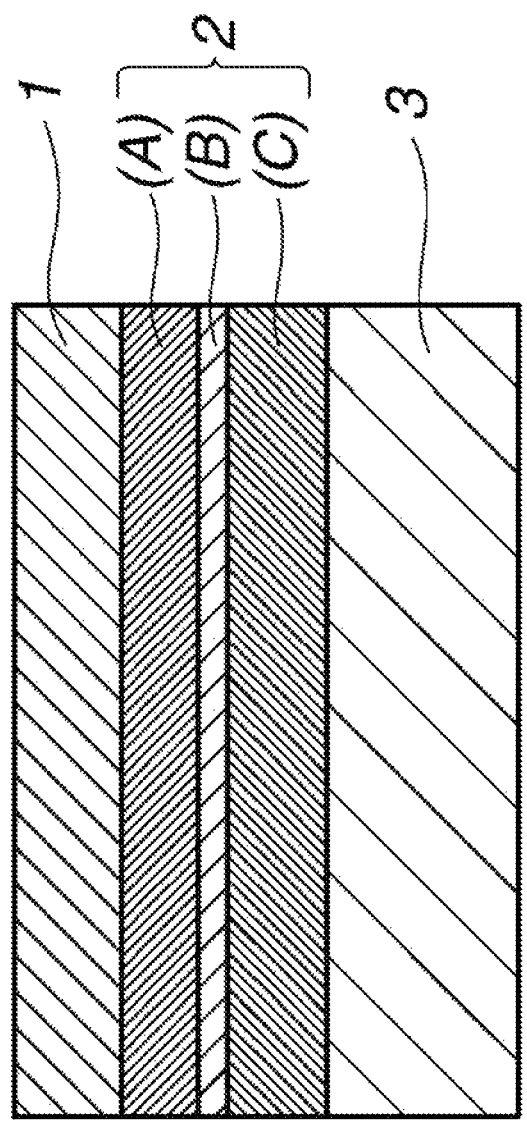

WAFER PROCESSING TEMPORARY BONDING ARRANGEMENT, WAFER PROCESSING LAMINATE, AND THIN WAFER MANUFACTURING METHOD

CROSS-REFERENCE TO RELATED APPLICATION

This non-provisional application claims priority under 35 U.S.C. § 119(a) on Patent Application No. 2015-131064 filed in Japan on Jun. 30, 2015, the entire contents of which are hereby incorporated by reference.

TECHNICAL FIELD

This invention relates to a temporary bonding arrangement for wafer processing, a wafer processing laminate, and a method for manufacturing a thin wafer.

BACKGROUND ART

Three-dimensional semiconductor packages become essential for a higher density and capacity. The 3D semiconductor packaging technology is by thinning semiconductor chips, and stacking them in multilayer structure while providing through-silicon via (TSV) interconnects. Fabrication of such packages requires the steps of thinning a substrate having a semiconductor circuit formed therein by grinding its non-circuit forming surface or back surface, and forming TSV and electrodes on the back surface. In the prior art, prior to the step of grinding the back surface of a silicon substrate, a protective tape is attached to the surface of the substrate opposite to the surface to be ground for preventing the wafer from breakage during the grinding step. Since the protective tape is based on an organic resin film, it is flexible, but has insufficient strength and heat resistance to withstand the TSV forming step and the step of forming interconnects on the back surface.

It is then proposed to bond a semiconductor substrate to a support of silicon or glass, for example, via an adhesive layer. The resulting system is sufficient to withstand the steps of grinding the back surface and forming TSV and electrodes on the back surface. The adhesive layer for bonding the substrate to the support is critical for this system. The adhesive layer must bond the substrate to the support without leaving gaps, be durable enough to withstand the subsequent steps, and eventually allow the thin wafer to be readily released from the support. The adhesive layer is referred herein to as "temporary adhesive layer" or "temporary bonding arrangement" since it is finally removed.

With regard to temporary adhesive layers and removal thereof, Patent Document 1 discloses a layer of an adhesive composition containing a light absorbing agent. The adhesive layer is irradiated with high intensity light for decomposing the adhesive composition so that the layer may be removed. Patent Document 2 discloses a layer of an adhesive composition comprising a heat melting hydrocarbon compound, wherein the layer can be bonded and released in the heat molten condition. The former technology requires an expensive tool such as laser and a longer time of treatment per substrate. The latter technology is simple because of control only by heat, but is applicable to a limited range because of instability at high temperatures in excess of 200° C. These temporary adhesive layers are not adequate to form a layer of uniform thickness on a heavily stepped substrate and to provide a complete bond to the support.

Patent Documents 3 and 4 disclose the use of a silicone adhesive composition as the temporary adhesive layer. A substrate is bonded to a support with an addition reaction curable silicone adhesive composition. On removal, the assembly is immersed in an etching solution capable of dissolving or decomposing the silicone resin, whereby the substrate is separated from the support. This method takes a very long time for removal and is applicable to the commercial manufacture process with difficulty. Patent Document 4 discloses a temporary bonding arrangement of a layered structure consisting of a thermoplastic resin layer and a thermosetting resin layer. Since the resin layer in the arrangement has an undesirable flow in the process temperature range, it is difficult to use the arrangement in the high temperature range.

CITATION LIST

Patent Document 1: JP-A 2004-64040 (U.S. Pat. No. 8,800, 631, EP 1550156)
Patent Document 2: JP-A 2006-328104
Patent Document 3: U.S. Pat. No. 7,541,264
Patent Document 4: JP-A 2014-131004 (U.S. Pat. No. 9,263,333, EP 2738797)

SUMMARY OF INVENTION

An object of the invention is to provide a temporary bonding arrangement for wafer processing or a wafer processing laminate, which facilitates to establish a temporary bond between a wafer and a support, enables to form an adhesive layer of uniform thickness even on a heavily stepped substrate, is compatible with the TSV forming and back surface interconnect forming steps, has resistance to wafer thermal processing such as chemical vapor deposition (CVD), allows for easy removal, and offers high productivity in the manufacture of thin wafers. Another object is to provide a method for manufacturing a thin wafer using the arrangement or laminate.

In one aspect, the invention provides an arrangement for temporarily bonding a wafer to a support for wafer processing, the wafer having a circuit-forming front surface and a back surface to be processed. The temporary bonding arrangement is a composite temporary adhesive layer comprising a first temporary bond layer (A) of thermoplastic resin, a second temporary bond layer (B) of thermosetting siloxane polymer which is laid contiguous to the first temporary bond layer, and a third temporary bond layer (C) of thermosetting polymer which is laid contiguous to the second temporary bond layer. The first temporary bond layer (A) is a resin layer of a composition comprising (A-1) 100 parts by weight of a thermoplastic resin and (A-2) an amount of a curing catalyst to provide more than 0 part to 1 part by weight of an active ingredient per 100 parts by weight of component (A-1). The thermosetting siloxane polymer layer (B) is cured with the aid of the curing catalyst in the layer (A) which is contiguous to the layer (B).

In another aspect, the invention provides a wafer processing laminate comprising a support, a temporary adhesive layer on the support, and a wafer laid contiguous to the temporary adhesive layer, the wafer having a circuit-forming front surface and a back surface to be processed. The temporary adhesive layer is a composite temporary adhesive layer comprising a first temporary bond layer (A) of thermoplastic resin, a second temporary bond layer (B) of thermosetting siloxane polymer which is laid contiguous to the first temporary bond layer, and a third temporary bond layer (C) of thermosetting polymer which is laid contiguous to the second temporary bond layer. The first temporary bond layer (A) is a resin layer of a composition comprising (A-1) 100 parts by weight of a thermoplastic resin and (A-2) an amount of a curing catalyst to provide more than 0 part to 1 part by weight of an active ingredient per 100 parts by weight of component (A-1). The thermosetting siloxane polymer layer (B) is cured with the aid of the curing catalyst in the layer (A) which is contiguous to the layer (B).

The use of the temporary bonding arrangement and wafer processing laminate thus constructed facilitates to establish a temporary bond between the wafer and the support, enables to form an adhesive layer of uniform thickness even on a heavily stepped substrate, is compatible with the TSV forming and back surface interconnect forming steps, offers high resistance to thermal steps such as CVD, and allows for easy removal. These contribute to the increased productivity of thin wafers.

In a preferred embodiment, component (A-2) is a platinum-based catalyst.

In a preferred embodiment, the second temporary bond layer (B) is a polymer layer of a composition comprising (B-1) 100 parts by weight of an organopolysiloxane having an alkenyl group in the molecule and (B-2) an organohydrogenpolysiloxane having at least two silicon-bonded hydrogen atoms (i.e., SiH groups) per molecule in an amount to give a molar ratio of SiH group in component (B-2) to alkenyl group in component (B-1) of 0.3/1 to 15/1, which is cured with the aid of the curing catalyst in the layer (A) which is contiguous to the layer (B). The second temporary bond layer (B) of thermosetting siloxane polymer thus constructed may be effectively cured with component (A-2) in the first temporary bond layer (A) of thermoplastic resin.

The thermosetting siloxane polymer layer (B) is preferably such that in a 180° peel test on a test piece of 25 mm wide having a thermosetting siloxane polymer layer (B) which has been laid on a thermoplastic resin layer (A) and heat cured thereto, the force required to peel layer (B) from layer (A) at an angle of 180° is 2 gf to 50 gf at 25° C. The thermosetting siloxane polymer layer (B) having such a peeling force prevents a wafer from being moved aside during wafer grinding and ensures resistance to subsequent steps such as CVD and easy removal.

In a preferred embodiment, the third temporary bond layer (C) is a polymer layer of a composition comprising 100 parts by weight of a siloxane bond-containing polymer comprising recurring units of the general formula (1) and having a weight average molecular weight of 3,000 to 500,000, and 0.1 to 50 parts by weight of a crosslinker which is selected from among an amino condensate, melamine resin and urea resin modified with formaldehyde or formaldehyde-alcohol, a phenol compound having on average at least two methylol or alkoxymethylol groups per molecule, and an epoxy compound having on average at least two epoxy groups per molecule.

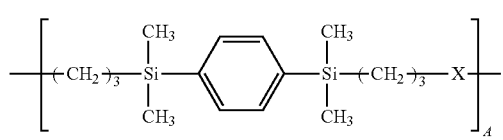
(1)

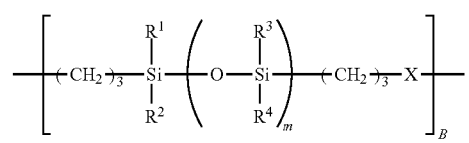

Herein $R^1$ to $R^4$ are each independently a monovalent hydrocarbon group of 1 to 8 carbon atoms, m is an integer of 1 to 100, B is a positive number, A is 0 or a positive number, A+B=1, X is a divalent organic group having the general formula (2) or 1,3-divinyltetramethyldisiloxane, with a divalent organic group having formula (2) being essentially contained,

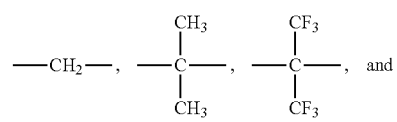
(2)

wherein Z is a divalent organic group selected from the following:

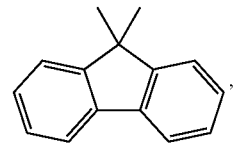

N is 0 or 1, $R^5$ and $R^6$ are each independently an alkyl or alkoxy group of 1 to 4 carbon atoms, and k is 0, 1 or 2. The third temporary bond layer (C) of thermosetting polymer thus constructed is more heat resistant.

In another preferred embodiment, the third temporary bond layer (C) is a polymer layer of a composition comprising 100 parts by weight of a siloxane bond-containing polymer comprising recurring units of the general formula (3) and having a weight average molecular weight of 3,000 to 500,000, and 0.1 to 50 parts by weight of a crosslinker which is selected from among a phenol compound having on average at least two phenol groups per molecule and an epoxy compound having on average at least two epoxy groups per molecule.

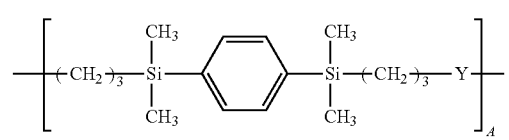
(3)

-continued

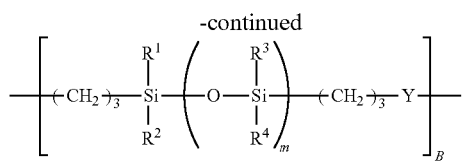

Herein $R^1$ to $R^4$ are each independently a monovalent hydrocarbon group of 1 to 8 carbon atoms, m is an integer of 1 to 100, B is a positive number, A is 0 or a positive number, A+B=1, Y is a divalent organic group having the general formula (4) or 1,3-divinyltetramethyldisiloxane, with a divalent organic group having formula (4) being essentially contained,

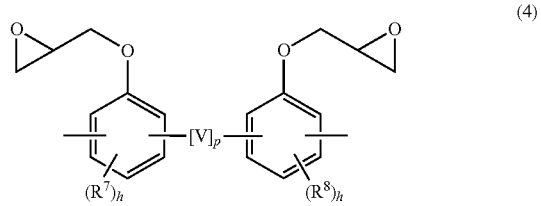

wherein V is a divalent organic group selected from the following:

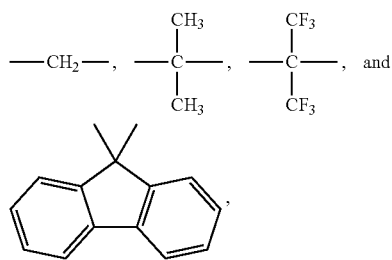

p is 0 or 1, $R^7$ and $R^8$ are each independently an alkyl or alkoxy group of 1 to 4 carbon atoms, and h is 0, 1 or 2. The third temporary bond layer (C) of thermosetting polymer thus constructed is more heat resistant.

In a further aspect, the invention provides a method for manufacturing a thin wafer by releasably bonding a wafer to a support via the temporary bonding arrangement defined above, the temporary bonding arrangement comprising a combination of a thermoplastic resin layer (A), a thermosetting siloxane polymer layer (B), and a thermosetting polymer layer (C), the wafer having a circuit-forming front surface and a non-circuit-forming back surface, with the circuit-forming surface facing the support, the method comprising the steps of:

(a) forming polymer layer (C) on the support, forming polymer layer (B) on polymer layer (C), forming resin layer (A) on the wafer, and laminating together the support having polymer layers (C) and (B) formed thereon and the wafer having resin layer (A) formed thereon in vacuum, (b) heat curing the polymer layers, (c) grinding or polishing the non-circuit-forming surface of the wafer bonded to the support, (d) processing the non-circuit-forming surface of the wafer, (e) releasing the processed wafer from the support, and (f) washing any adhesive layers left on the circuit-forming surface of the wafer.

Since the thin wafer manufacturing method uses the composite temporary adhesive layer to bond the wafer to the support, a thin wafer having a TSV structure or bump connect structure can be readily manufactured.

Advantageous Effects of Invention

Many advantages are obtained when the wafer processing laminate is prepared using the temporary bonding arrangement. Since the thermosetting siloxane polymer layer (B) is cured with a catalyst added to the thermoplastic resin layer (A), an adhesive layer of uniform thickness is formed even on a heavily stepped wafer typically having steps as high as 40 μm or more on its surface, without insufficient step coverage (or embedment) and other failures. By virtue of thickness uniformity of the adhesive layer, a uniform thin wafer of up to 50 μm can be readily manufactured. After the wafer is thinned, the wafer can be readily removed from the support, for example, at room temperature, that is, a fragile thin wafer can be readily manufactured. After removal, the wafer has only the thermoplastic resin layer (A) left thereon, but not the thermosetting siloxane polymer layer (B), and is thus easier to clean up. Furthermore, since each layer in the temporary bonding arrangement is laid in uncured state, the temporary bonding arrangement provides for effective temporary bonding to a heavily stepped substrate.

BRIEF DESCRIPTION OF DRAWING

FIG. 1 is a cross-sectional view of a wafer processing laminate in one embodiment of the invention.

DESCRIPTION OF PREFERRED EMBODIMENT

There is a need for a temporary bonding arrangement for wafer processing, which facilitates to establish a temporary bond between a wafer and a support, enables to form an adhesive layer of uniform thickness even on a heavily stepped substrate, is compatible with the TSV forming and back surface interconnect forming steps, and resistant to wafer thermal processing like CVD, allows for easy removal, and offers high productivity in the manufacture of thin wafers.

The inventors have found that a thin wafer having a TSV structure or bump interconnect structure can be easily manufactured using a composite temporary adhesive layer comprising (A) a first temporary bond layer of thermoplastic resin, (B) a second temporary bond layer of thermosetting siloxane polymer, and (C) a third temporary bond layer of thermosetting polymer.

In one embodiment of the invention, a laminate for wafer processing is shown in FIG. 1 as comprising a wafer (or device wafer) 1 to be processed, a support 3 for carrying the wafer 1 during its processing, and a temporary adhesive layer (or temporary bonding arrangement) 2 intervening between the wafer 1 and the support 3. The wafer 1 has a circuit-forming front surface and a back surface to be processed. The temporary bonding arrangement 2 includes (A) a first temporary bond layer of thermoplastic resin composition containing components (A-1) and (A-2), (B) a second temporary bond layer of thermosetting siloxane polymer, and (C) a third temporary bond layer of thermosetting polymer.

Although the invention is described below by mainly referring to the wafer processing laminate shown in FIG. 1 which includes the temporary bonding arrangement having layers (A), (B) and (C) stacked in order from the wafer side, the wafer processing laminate may include another layer.

The temporary bonding arrangement for wafer processing includes at least layers (A), (B), and (C).

Temporary Adhesive Layer

——First Temporary Bond Layer (A) of Thermoplastic Resin

The first temporary bond layer (A) which constitutes the temporary bonding arrangement or wafer processing laminate is formed of a thermoplastic resin (polymer). The thermoplastic resin composition comprises (A-1) 100 parts by weight of a thermoplastic resin and (A-2) an amount of a curing catalyst to provide more than 0 part to 1 part by weight of an active ingredient per 100 parts by weight of component (A-1).

Component (A-1)

Component (A-1) is a thermoplastic resin. In view of applicability to a stepped silicon wafer, a thermoplastic resin having good spin coating properties is advantageously used as the material of which first temporary bond layer (A) is made. In particular, thermoplastic resins having a glass transition temperature (Tg) of about −80° C. to about 120° C. are preferred, including olefin base thermoplastic elastomers, polybutadiene base thermoplastic elastomers, styrene base thermoplastic elastomers, styrene-butadiene base thermoplastic elastomers, and styrene-polyolefin base thermoplastic elastomers. Inter alia, hydrogenated polystyrene base elastomers are more preferred because of heat resistance. Such thermoplastic resins are commercially available as Tuftect (Asahi Kasei Chemicals Corporation), ESPOLEX® SB Series (Sumitomo Chemical Co., Ltd.), RABALON® (Mitsubishi Chemical Corp.), SEPTON® (Kuraray Co., Ltd.), and DYNARON® (JSR Corporation). Also preferred are cycloolefin polymers as typified by ZEONEX® (ZEON Corp.) and cyclic olefin copolymers as typified by TOPAS® (Polyplastics Co., Ltd.).

As mentioned above, the thermoplastic resin layer (A) is preferably formed of a thermoplastic elastomer. The resins of component (A-1) may be used alone or in admixture of two or more.

The thermoplastic resin layer (A) of such construction allows for easy release of the wafer from the support after thinning, suggesting ease of handling of a fragile thin wafer.

Component (A-2)

Component (A-2) is a curing catalyst with which a contiguous thermosetting siloxane polymer layer (B) is cured.

An appropriate amount of component (A-2) added is to provide more than 0 part to 1 part by weight of an active ingredient per 100 parts by weight of component (A-1), preferably 1 to 5,000 ppm of active ingredient. As long as component (A-2) is at least 1 ppm, the thermosetting siloxane layer (B) is effectively curable. If the amount of component (A-2) exceeds 1 part by weight, the pot-life of the treatment solution may become undesirably short. Component (A-2) is homogeneously blended in a solution of component (A-1).

Preferably component (A-2) is a platinum group metal-based catalyst, specifically platinum-based catalyst. Examples include chloroplatinic acid, an alcohol solution of chloroplatinic acid, reaction products of chloroplatinic acid with alcohols, reaction products of chloroplatinic acid with olefin compounds, and reaction products of chloroplatinic acid with vinyl-containing siloxanes.

Since catalyst (A-2) for curing layer (B) is added to thermoplastic resin layer (A), layer (B) may be temporarily bonded in the uncured state. This provides for effective temporary bonding to a heavily stepped substrate.

The thermoplastic resin layer may be formed by dissolving the thermoplastic resin in a solvent and applying the solution onto a semiconductor substrate, typically silicon wafer by a suitable coating technique such as spin coating or spray coating. Suitable solvents include hydrocarbon solvents such as nonane, p-menthane, pinene, and isooctane. Inter alia, nonane, p-menthane and isooctane are preferred for efficient coating. An appropriate amount of the solvent used is 300 to 3,500 parts by weight per 100 parts by weight of the thermoplastic resin.

Although the coating thickness is not particularly limited, a resin coating is desirably formed so as to accommodate steps on the substrate. Preferably the resin is coated to a thickness of 0.5 to 50 μm, more preferably 0.5 to 20 μm. To the thermoplastic resin, an antioxidant for improving heat resistance and a surfactant for facilitating coating may be added. A typical antioxidant is di-t-butylphenol. Suitable surfactants include fluorosilicone surfactants, for example, X-70-1102 (Shin-Etsu Chemical Co., Ltd.).

——Second Temporary Bond Layer (B) of Thermosetting Siloxane Polymer

The second temporary bond layer (B) which constitutes the temporary bonding arrangement or wafer processing laminate is formed of a thermosetting siloxane polymer. The thermosetting siloxane polymer composition comprises components (B-1) and (B-2). The composition is cured with the aid of the curing catalyst contained in layer (A) which is laid contiguous to layer (B). The composition comprises (B-1) 100 parts by weight of an organopolysiloxane having an alkenyl group in the molecule, (B-2) an organohydrogenpolysiloxane having at least two silicon-bonded hydrogen atoms (i.e., SiH groups) per molecule in an amount to give a molar ratio of SiH group in component (B-2) to alkenyl group in component (B-1) of 0.3/1 to 15/1, and (B-3) an optional component.

Component (B-1)

Component (B-1) is an organopolysiloxane having an alkenyl group in the molecule, preferably a straight or branched organopolysiloxane having an alkenyl group in the molecule in an amount to give the moles of alkenyl group to the moles of Si (alkenyl/Si) of 0.3 to 10 mol %, especially 0.6 to 9 mol %.

Examples of the organopolysiloxane are those of the general formulae (5) and (6).

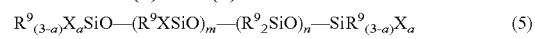

$$R^9{}_{(3-a)}X_aSiO\text{---}(R^9XSiO)_m\text{---}(R^9{}_2SiO)_n\text{---}SiR^9{}_{(3-a)}X_a \qquad (5)$$

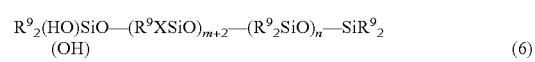

$$R^9{}_2(HO)SiO\text{---}(R^9XSiO)_{m+2}\text{---}(R^9{}_2SiO)_n\text{---}SiR^9{}_2(OH) \qquad (6)$$

Herein $R^9$ is each independently a monovalent hydrocarbon group free of aliphatic unsaturation, X is each independently an alkenyl-containing monovalent organic group, and a is an integer of 0 to 3. In formula (5), 2a+m is such a number as to give an alkenyl content per molecule of 0.3 to 10 mol %. In formula (6), m+2 is such a number as to give an alkenyl content per molecule of 0.3 to 10 mol %. The subscript m is 0 or a positive number of up to 500, and n is a positive number of 1 to 10,000.

In formulae (5) and (6), $R^9$ is preferably a monovalent hydrocarbon group of 1 to 10 carbon atoms, examples of which include alkyl groups such as methyl, ethyl, propyl and butyl, cycloalkyl groups such as cyclohexyl, and aryl groups such as phenyl and tolyl, with alkyl groups such as methyl and phenyl being preferred.

X is preferably an alkenyl-containing monovalent organic group of 2 to 10 carbon atoms, examples of which include alkenyl groups such as vinyl, allyl, hexenyl and octenyl; (meth)acryloylalkyl groups such as acryloylpropyl, acryloylmethyl and methacryloylpropyl; (meth)acryloxyalkyl groups such as acryloxypropyl, acryloxymethyl, methacryloxypropyl and methacryloxymethyl; and an alkenyl-containing monovalent hydrocarbon groups such as cyclohexenylethyl and vinyloxypropyl, with vinyl being preferred from the industrial aspect.

In formula (5), "a" is an integer of 0 to 3. The value of "a" which is 1 to 3 means that the molecular chain is terminated with an alkenyl group. By virtue of the highly reactive alkenyl group at the end of molecular chain, the reaction is advantageously completed in a short time. Industrially, a=1 is most preferred for cost. The alkenyl-containing organopolysiloxane is preferably oily or gum-like while it may be linear or branched. Component (B-1) may be used alone or in admixture of two or more.

Component (B-2)

Component (B-2) is an organohydrogenpolysiloxane having at least two silicon-bonded hydrogen atoms (i.e., SiH groups) per molecule, which serves as a crosslinker. The organohydrogenpolysiloxane (B-2) has at least 2, preferably 2 to 100, and more preferably 3 to 50 SiH groups per molecule while it may be linear, branched or cyclic.

Preferably the organohydrogenpolysiloxane (B-2) has a viscosity at 25° C. of 1 to 5,000 mPa·s, more preferably 5 to 500 mPa·s, as measured by a rotational viscometer. Component (B-2) may be used in admixture of two or more.

Component (B-2) is compounded in an amount to give a molar ratio of SiH group in component (B-2) to alkenyl group in component (B-1) (SiH/alkenyl) in a range of 0.3/1 to 15/1, preferably 0.3/1 to 10/1, and more preferably 1/1 to 8/1. If the SiH/alkenyl molar ratio is less than 0.3, crosslinking density may be too low to cure the adhesive layer. If the SiH/alkenyl molar ratio exceeds 15, crosslinking density may be too high to attain appropriate bonding force (or adhesion strength) and tack, and the treatment solution may have an insufficient pot-life.

The thermosetting siloxane polymer composition of layer (B) may further contain (B-3) an organopolysiloxane comprising $R^{10}_3SiO_{0.5}$ units and $SiO_2$ units wherein $R^{10}$ is each independently a substituted or unsubstituted monovalent hydrocarbon group of 1 to 10 carbon atoms. The molar ratio of $R^{10}_3SiO_{0.5}$ units to $SiO_2$ units ranges from 0.5/1 to 1.7/1, preferably 0.6/1 to 1.2/1. The amount of component (B-3) added is preferably 0 to 50 parts by weight per 100 parts by weight of component (B-1) in the thermosetting siloxane polymer composition.

Examples of $R^{10}$ include alkyl groups such as methyl, ethyl, propyl and butyl; cycloalkyl; phenyl; alkenyl groups such as vinyl, allyl and hexenyl; and substituted forms of the foregoing monovalent hydrocarbon groups in which some or all hydrogen atoms are substituted by halogen atoms such as fluorine. Inter alia, methyl is preferred.

Component (B-3) may be used in admixture of two or more. Besides, $R^{10}SiO_{1.5}$ units and/or $R^{10}_2SiO$ units may be incorporated in component (B-3) as long as the desired properties are not compromised.

The thermosetting siloxane polymer layer (B) may be formed on an uncured thermosetting polymer layer (C) on a support by applying a solution of components (B-1) and (B-2) by a suitable technique such as spin coating or roll coating. When layer (B) is formed by spin coating or the like, a solution of the resin is preferably prepared prior to coating. To this end, hydrocarbon solvents such as pentane, hexane, cyclohexane, isooctane, nonane, decane, p-menthane, pinene, isododecane and limonene are preferably used. An appropriate amount of the solvent used is 100 to 10,000 parts by weight per 100 parts by weight of components (B-1) and (B-2) combined. To the polymer solution of layer (B), any well-known antioxidant may be added for improving heat resistance.

The thermosetting siloxane polymer layer (B) is formed to a thickness in the range of 0.1 to 30 μm, more preferably 1.0 to 15 μm. As long as the layer (B) is 0.1 μm or more, it is able to cover the entire surface without leaving uncoated spots. As long as the layer (B) is 30 μm or less, it can withstand the grinding step in the manufacture of a thin wafer. To the thermosetting siloxane polymer layer (B), a filler such as silica may be added for further enhancing heat resistance. Specifically up to 50 parts by weight of the filler may be added to 100 parts by weight of components (B-1) and (B-2) combined.

The thermosetting siloxane polymer layer (B) is preferably such that in a 180° peel test on a test piece of 25 mm wide having a thermosetting siloxane polymer layer (B) which has been laid on a thermoplastic resin layer (A) and heat cured, the force required to peel layer (A) from layer (B) at an angle of 180° is 2 gf to 50 gf at 25° C. The thermosetting siloxane polymer layer (B) having such a peeling force prevents a wafer from being moved aside during wafer grinding and ensures resistance to subsequent processing such as CVD and easy removal.

——Third Temporary Bond Layer (C) of Thermosetting Polymer

The third temporary bond layer (C) which constitutes the temporary bonding arrangement or wafer processing laminate is formed of a thermosetting polymer. Although layer (C) is not particularly limited, it is preferably a polymer layer of a thermosetting composition composed mainly of a thermosetting siloxane-modified polymer having the general formula (1) or (3). In layer (C), a blend of a polymer of formula (1) and a polymer of formula (3) may also be used. In this case, the polymer of formula (1) and the polymer of formula (3) may be blended in a weight ratio of preferably 0.1:99.9 to 99.9:0.1, more preferably 1:99 to 99:1.

In one embodiment, the thermosetting polymer is a phenolic siloxane polymer or siloxane bond-containing polymer comprising recurring units of the general formula (1) and having a weight average molecular weight (Mw) of 3,000 to 500,000, preferably 10,000 to 100,000. It is noted throughout the disclosure that Mw is measured by gel permeation chromatography (GPC) versus polystyrene standards.

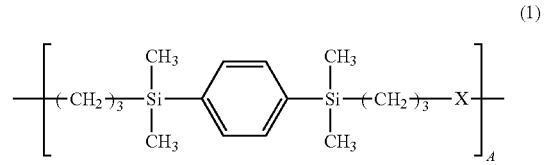

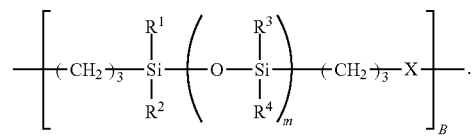

Herein $R^1$ to $R^4$ are each independently a monovalent hydrocarbon group of 1 to 8 carbon atoms. The subscript m is an integer of 1 to 100, B is a positive number, A is 0 or a positive number, and A+B=1. X is a divalent organic group having the general formula (2) or 1,3-divinyltetramethyldisiloxane, with a divalent organic group having formula (2) being essentially contained. Preferably A is 0 to 0.9, and B is 0.1 to 1. When A is more than 0, A is preferably 0.1 to 0.7 and B is preferably 0.3 to 0.9.

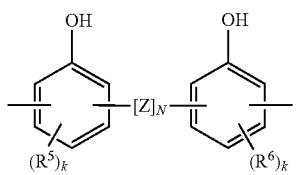

(2)

Herein Z is a divalent organic group selected from the following.

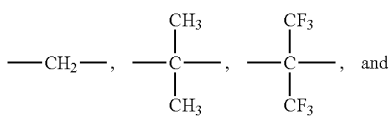
, and
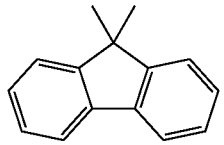

N is 0 or 1, $R^5$ and $R^6$ are each independently an alkyl or alkoxy group of 1 to 4 carbon atoms, and k is 0, 1 or 2.

Suitable groups of R to $R^4$ include methyl, ethyl and phenyl. The subscript m is preferably an integer of 3 to 60, more preferably 8 to 40. B and A are preferably such numbers as to give a ratio B/A of more than 0/1 to up to 20/1, more preferably 0.5/1 to 5/1.

In another embodiment, the thermosetting polymer is an epoxy-modified siloxane polymer or siloxane bond-containing polymer comprising recurring units of the general formula (3) and having a Mw of 3,000 to 500,000.

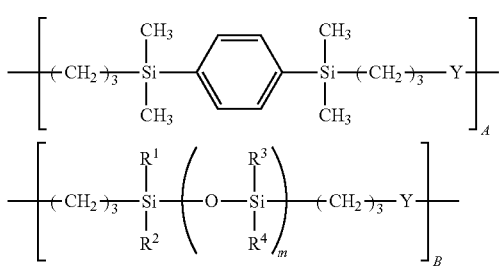

(3)

Herein $R^1$ to $R^4$ are each independently a monovalent hydrocarbon group of 1 to 8 carbon atoms, m is an integer of 1 to 100, B is a positive number, A is 0 or a positive number, and A+B=1. Y is a divalent organic group having the general formula (4) or 1,3-divinyltetramethyldisiloxane, with a divalent organic group having formula (4) being essentially contained. Preferably A is 0 to 0.9, and B is 0.1 to 1. When A is more than 0, A is preferably 0.1 to 0.7 and B is preferably 0.3 to 0.9.

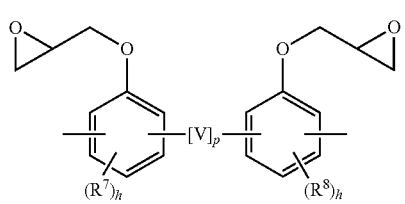

(4)

Herein V is a divalent organic group selected from the following:

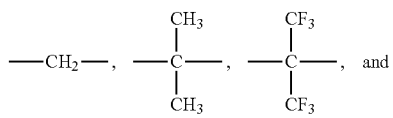
, and
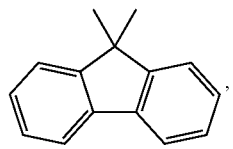

p is 0 or 1, $R^7$ and $R^8$ are each independently an alkyl or alkoxy group of 1 to 4 carbon atoms, and h is 0, 1 or 2.

Exemplary groups of $R^1$ to $R^4$ and suitable values of m are as described above for formula (1).

The thermosetting polymer composition composed mainly of the thermosetting siloxane-modified polymer of formula (1) or (3) defined above contains a crosslinker for the thermosetting purpose. For the phenolic siloxane polymer of formula (1), the crosslinker is at least one member selected from among an amino condensate, melamine resin and urea resin modified with formaldehyde or formaldehyde-alcohol, a phenol compound having on average at least two methylol or alkoxymethylol groups per molecule, and an epoxy compound having on average at least two epoxy groups per molecule.

Typically, the amino condensate, melamine resin and urea resin which are modified with formaldehyde or formaldehyde-alcohol are prepared by the following methods. For example, the melamine resin (or condensate) modified with formaldehyde or formaldehyde-alcohol may be obtained by effecting addition polycondensation of a modified melamine monomer (e.g., trimethoxymethylmonomethylolmelamine) or oligomer thereof (e.g., dimer, trimer) with formaldehyde in a customary way until a desired molecular weight is reached. The modified melamine resins may be used alone or in admixture.

Also, the urea resin (condensate) modified with formaldehyde or formaldehyde-alcohol may be prepared, for example, by modifying a urea condensate having a desired molecular weight with formaldehyde into a methylol form in a well-known manner, and optionally, further modifying it with an alcohol into an alkoxy form. Illustrative examples of the modified urea resin include methoxymethylated urea condensates, ethoxymethylated urea condensates, and propoxymethylated urea condensates. These modified urea resins may be used alone or in admixture.

Examples of the phenol compound having on the average at least two methylol or alkoxymethylol groups per molecule include (2-hydroxy-5-methyl)-1,3-benzenedimethanol and 2,2',6,6'-tetramethoxymethylbisphenol A. These phenol compounds may be used alone or in admixture.

For the epoxy-modified siloxane polymer of formula (3), the crosslinker is at least one member selected from among an epoxy compound having on average at least two epoxy groups per molecule and a phenol compound having on average at least two phenol groups per molecule.

Preferred epoxy compounds having multi-functional epoxy groups for use with the polymers of formulae (1) and (3) include, but are not limited to, multi-functional epoxy resins having a functionality of 2, 3, 4 or more, for example, those resins commercially available under the trade name of EOCN-1020, EOCN-102S, XD-1000, NC-2000-L, EPPN-201, GAN and NC6000 from Nippon Kayaku Co., Ltd. Crosslinkers of the following formulae are also useful.

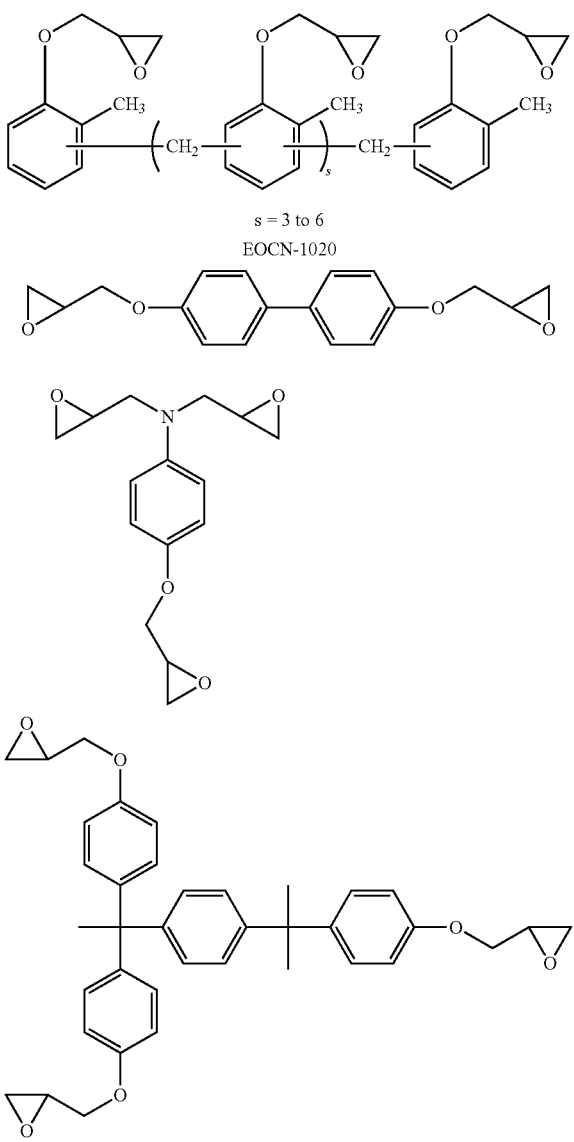

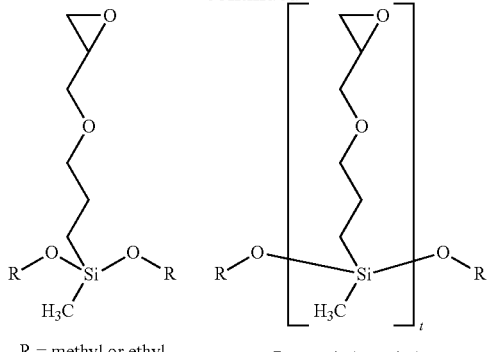

R = methyl or ethyl

R = methyl or ethyl
t = 1  20 wt %
t = 2  75 wt %
t ≥ 3  5 wt %

Suitable crosslinkers for use with the epoxy-modified siloxane polymer of formula (3) include m and p-cresol novolak resins, e.g., EP-6030G from Asahi Organic Chemicals Industry Co., Ltd., trifunctional phenol compounds, e.g., Tris-P-PA from Honshu Chemical Industry Co., Ltd., and tetrafunctional phenol compounds, e.g., TEP-TPA from Asahi Organic Chemicals Industry Co., Ltd.

The crosslinker is added in an amount of 0.1 to 50 parts, preferably 0.1 to 30 parts, and more preferably 1 to 20 parts by weight per 100 parts by weight of the thermosetting polymer. More than one crosslinker may be added.

To the composition, a curing catalyst such as acid anhydride may be added in an amount of up to 10 parts by weight per 100 parts by weight of the thermosetting polymer.

The thermosetting polymer composition may be dissolved in a solvent to form a solution which is applied to a support by a suitable coating technique such as spin coating, roll coating or die coating. Examples of the solvent used herein include ketones such as cyclohexanone, cyclopentanone and methyl-2-n-amylketone, alcohols such as 3-methoxybutanol, 3-methyl-3-methoxybutanol, 1-methoxy-2-propanol and 1-ethoxy-2-propanol, ethers such as propylene glycol monomethyl ether, ethylene glycol monomethyl ether, propylene glycol monoethyl ether, ethylene glycol monoethyl ether, propylene glycol dimethyl ether and diethylene glycol dimethyl ether, and esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, t-butyl acetate, t-butyl propionate, propylene glycol mono-t-butyl ether acetate and γ-butyrolactone, which may be used alone or in admixture. An appropriate amount of the solvent used is 40 to 150 parts by weight per 100 parts by weight of the thermosetting polymer.

Notably, any well-known antioxidants and fillers such as silica may be added to the composition in an amount of up to 50 parts by weight per 100 parts by weight of the thermosetting polymer for further enhancing heat resistance. Also a surfactant may be added for improving coating uniformity. Suitable antioxidants include hindered phenol compounds such as tetrakis[methylene-(3,5-di-t-butyl-4-hydroxyhydrocinnamate)]methane (ADK STAB AO-60 from Adeka Corp.).

The third temporary bond layer (C) is preferably deposited such that the cured thickness is in the range of 15 to 150 μm, more preferably 20 to 120 μm, depending on steps on the wafer. When the layer (C) is at least 15 μm, it can withstand the grinding step for the thinning of a wafer. When the layer (C) is up to 150 μm, it is practically acceptable because the risk of deformation during the heat treatment step such as TSV forming step is eliminated.

Thin Wafer Manufacturing Method

A further embodiment of the invention is a method for manufacturing a thin wafer, which is characterized in that a composite temporary adhesive layer (or temporary bonding arrangement) comprising a thermoplastic resin layer (A), a thermosetting siloxane layer (B) and a thermosetting polymer layer (C) defined above is used as a bond layer between a wafer (having a semiconductor circuit formed therein) and a support. The thin wafer manufactured by the method typically has a thickness of 5 to 300 μm, more typically 10 to 100 μm.

The method for manufacturing a thin wafer from a starting wafer comprises steps (a) to (e). The starting wafer has a circuit-forming front surface and a non-circuit-forming back surface.

Step (a)

Step (a) is for bonding the starting wafer to a support via a temporary bonding arrangement in vacuum, with the circuit-forming surface of the wafer facing the support.

The wafer has a pair of opposed surfaces, that is, a front surface where a semiconductor circuit is formed and a back surface where a semiconductor circuit is not formed. The wafer which can be used herein is typically a semiconductor wafer. Suitable semiconductor wafers include silicon wafers, germanium wafers, gallium-arsenic wafers, gallium-phosphorus wafers, and gallium-arsenic-aluminum wafers. Although the thickness of the wafer is not particularly limited, it is typically 600 to 800 μm, more typically 625 to 775 μm. The invention is advantageously applicable to a wafer having steps on its surface where a semiconductor circuit is formed. The steps are typically 10 to 80 μm, preferably 20 to 70 μm deep. The bonding arrangement can be formed so as to closely bond to a wafer surface having steps as high as 40 μm or more.

The support which can be used herein may be selected from substrates such as silicon wafers, glass plates, and quartz wafers, though not limited thereto. In the practice of the invention, the support need not be light transmissive because there is no need to irradiate energy radiation to the temporary adhesive layer through the support.

The temporary bond layers (A), (B) and (C) may be pre-formed as films, which may be attached to the wafer or the support. Alternatively, their solutions may be applied to the wafer or the support by a suitable coating technique such as spin coating or roll coating. After coating, prebake is performed at a temperature of 80 to 200° C., preferably 100 to 180° C., depending on the volatility of a particular solvent used. The resulting coated product is ready for use.

It is desirable to bond together the wafer having temporary bond layer (A) formed thereon with the support having polymer layers (C) and (B) formed in order thereon. As mentioned above, solutions of layer-forming materials may be coated to the wafer or the support, or the temporary bond layers which are pre-formed as films may be attached to the wafer or the support. In the latter case, any constituent layer may be formed on a protective film of polyethylene, polyester or the like. On stripping of the protective film, the layer is ready for use.

The wafer having layer (A) formed thereon and the support having layers (C) and (B) formed thereon are joined together via layers (A), (B) and (C) into an assembly (also referred to as bonded substrate). The assembly is uniformly compressed preferably at a temperature of 40 to 200° C., more preferably 60 to 180° C. in vacuum (or reduced pressure) to bond layers (A), (B) and (C) together. At this point of time, the catalyst in layer (A) promotes curing of layer (B) and bonding of layers (A) and (B) to complete a wafer processing laminate (in which the wafer is bonded to the support). The compressing time is 10 seconds to 10 minutes, preferably 30 seconds to 5 minutes.

The wafer bonding system used herein includes commercially available wafer bonders such as EVG520IS and 850 TB from EV Group, and XBC300 from SUSS MicroTec AG.

Step (b)

Step (b) is to thermally cure polymer layers (B) and (C). The polymer layers (B) and (C) are cured by heating the wafer processing laminate resulting from step (a) at 120 to 220° C., preferably 150 to 200° C. for 10 minutes to 4 hours, preferably 30 minutes to 2 hours.

Step (c)

Following is step (c) of grinding or polishing the non-circuit-forming surface of the wafer bonded to the support. Step (c) is intended to reduce the thickness of the wafer by grinding or polishing the wafer back surface of the wafer processing laminate resulting from step (a). The technique of grinding the wafer back surface is not particularly limited, and any well-known grinding techniques may be used. The wafer is ground by a grinding wheel (e.g., diamond grinding wheel), while preferably feeding water to the wafer and the wheel for cooling. As the means for grinding the wafer back surface, for example, a surface grinder DAG-810 by DISCO Co., Ltd. may be used. The wafer back surface may also be subjected to chemical mechanical polishing (CMP).

Step (d)

Step (d) is to process the non-circuit-forming surface of the wafer processing laminate which has been ground, i.e., the non-circuit-forming surface of the wafer which has been thinned by back surface grinding step (c). This step includes various processes which can be applied on the wafer level, for example, electrode formation, metal conductor formation, and protective film formation. More specifically, any conventional well-known processes may be applied, including metal sputtering for forming electrodes or the like, wet etching of a sputtered metal layer, formation of a pattern (serving as a mask for metal conductor formation) by resist coating, exposure and development, removal of resist, dry etching, metallization, silicon etching for TSV formation, and oxide film formation on silicon surface.

Step (e)

Step (e) is to release the wafer which has been processed in step (d) from the wafer processing laminate, that is, separating the thin wafer from the wafer processing laminate after processing in step (d) and before dicing. This release procedure is typically performed at a relatively low temperature from room temperature to about 60° C. Suitable release procedures for separating the wafer from the support include, but are not limited to, a pull-up procedure of holding the wafer or support of the wafer processing laminate horizontally, and pulling up the support or wafer at an angle relative to the horizon, and a peeling procedure of adhering a protective film to the ground surface of the wafer and peeling the protective film together with the wafer from the wafer processing laminate.

Either of these procedures may be used in the release step (e). The release procedure is not limited to the above procedures. The release procedure is typically performed at room temperature.

Step (f)

Step (e) of releasing the processed wafer from the support is followed by step (f) of cleaning the wafer to remove any temporary adhesive layer remaining on its circuit-forming surface. Typically the first temporary bond layer is left on the circuit-forming surface of the wafer which has been released in step (e). The first temporary bond layer may be removed, for example, by a peeling procedure of attaching a protective film to the circuit-forming surface on which the first temporary bond layer is left and peeling the protective film together with the first temporary bond layer from the wafer, or by a procedure of washing the wafer.

Step (f) may use any cleaning fluid which is capable of dissolving the thermoplastic resin of which the first temporary bond layer (A) is made. Suitable solvents include pentane, hexane, cyclohexane, decane, isononane, p-menthane, pinene, isododecane, and limonene, which may be used alone or in admixture. If removal is difficult, a base or acid may be added to the solvent. Suitable bases include amines such as ethanolamine, diethanolamine, triethanolamine, triethylamine and ammonia, and ammonium salts such as tetramethylammonium hydroxide. Suitable acids include organic acids such as acetic acid, oxalic acid, benzenesulfonic acid, and dodecylbenzenesulfonic acid. The base or acid is typically added in such amounts as to give a concentration of 0.01 to 10% by weight, preferably 0.1 to 5% by weight in the cleaning fluid. For more efficient removal of residues, any known surfactants may be added to the cleaning fluid. The washing step may be carried out by agitating the fluid with a puddle, spraying the fluid or immersing in a cleaning fluid bath. The temperature is preferably 10 to 80° C., more preferably 15 to 65° C. The dissolution of layer (A) in the cleaning fluid may be followed by water or alcohol rinsing and drying, yielding a thin wafer.

EXAMPLE

Examples of the invention are given below by way of illustration and not by way of limitation. All parts are by weight. Me stands for methyl and Vi for vinyl. Weight average molecular weight (Mw) and number average molecular weight (Mn) are measured by gel permeation chromatography (GPC) versus polystyrene standards.

Resin Solution Preparation Example 1

Thermoplastic resin SEPTON 4033 (hydrogenated styrene-isoprene-butadiene copolymer by Kuraray Co., Ltd, Tg ~25° C.), 24 g, was dissolved in 176 g of isononane to form a 12 wt % isononane solution of SEPTON 4033. To 100 parts (as solids) of the thermoplastic resin was added 0.3 part of a platinum catalyst (CAT-PL-5 by Shin-Etsu Chemical Co., Ltd.). The solution was filtered through a membrane filter with a pore size of 0.2 μm, obtaining an isononane solution of the thermoplastic resin (A-1).

Resin Solution Preparation Example 2

Thermoplastic resin SEPTON 4033 (hydrogenated styrene-isoprene-butadiene copolymer by Kuraray Co., Ltd, Tg ~25° C.), 30 g, was dissolved in 170 g of isononane to form a 15 wt % isononane solution of SEPTON 4033. To 100 parts of the thermoplastic resin was added 0.8 part of a platinum catalyst (CAT-PL-5 by Shin-Etsu Chemical Co., Ltd.). The solution was filtered through a membrane filter with a pore size of 0.2 μm, obtaining an isononane solution of the thermoplastic resin (A-2).

Resin Solution Preparation Example 3

Thermoplastic resin SEPTON 4033 (hydrogenated styrene-isoprene-butadiene copolymer by Kuraray Co., Ltd, Tg ~25° C.), 24 g, was dissolved in 176 g of isononane to form a 12 wt % isononane solution of SEPTON 4033. To 100 parts of the thermoplastic resin was added 0.05 part of a platinum catalyst (CAT-PL-5 by Shin-Etsu Chemical Co., Ltd.). The solution was filtered through a membrane filter with a pore size of 0.2 μm, obtaining an isononane solution of the thermoplastic resin (A-3).

Resin Solution Preparation Example 4

To a solution of 100 parts of a polydimethylsiloxane containing 3 mol % vinyl at both ends and side chains, endcapped with SiMe$_2$Vi, and having a Mn of 50,000 in 400 parts of isododecane, 5 parts (2 moles per mole of alkenyl groups) of an organohydrogenpolysiloxane of the following formula (M-6) was added and mixed. The mixture was filtered through a membrane filter with a pore size of 0.2 μm, obtaining a solution of the thermosetting siloxane polymer (B-1).

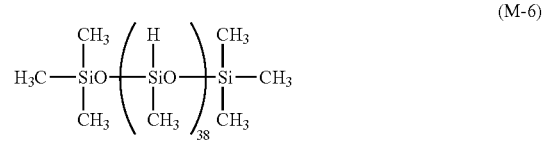

(M-6)

Resin Solution Preparation Example 5

To a solution of 100 parts of a polydimethylsiloxane containing 3 mol % vinyl at both ends and side chains, endcapped with SiMe$_2$Vi, and having a Mn of 80,000 in 400 parts of isododecane, 16 parts (6 moles per mole of alkenyl groups) of an organohydrogenpolysiloxane of the above formula (M-6) was added and mixed. The mixture was filtered through a membrane filter with a pore size of 0.2 μm, obtaining a solution of the thermosetting siloxane polymer (B-2).

Resin Solution Preparation Example 6

To a solution of 100 parts of a polydimethylsiloxane containing 3 mol % vinyl at both ends and side chains, endcapped with SiMe$_2$Vi, and having a Mn of 50,000 and 20 parts of polysiloxane consisting of Me$_3$SiO$_{0.5}$ units and SiO$_2$ units in a molar ratio Me$_3$SiO$_{0.5}$/SiO$_2$ of 0.80, in 400 parts of isododecane, 10 parts (4 moles per mole of alkenyl groups) of an organohydrogenpolysiloxane of the above formula (M-6) was added and mixed. The mixture was filtered through a membrane filter with a pore size of 0.2 μm, obtaining a solution of the thermosetting siloxane polymer (B-3).

Resin Solution Preparation Example 7

To a solution of 50 parts of a polydimethylsiloxane containing 8 mol % vinyl at both ends and side chains, endcapped with SiMe$_2$Vi, and having a Mn of 60,000 and 50 parts of a polydimethylsiloxane containing 2 mol % vinyl at both ends and side chains, endcapped with SiMe$_2$Vi, and having a Mn of 30,000, in 400 parts of isododecane, 13 parts (3 moles per mole of alkenyl groups) of an organohydrogenpolysiloxane of the above formula (M-6) was added and mixed. The mixture was filtered through a membrane filter with a pore size of 0.2 μm, obtaining a solution of the thermosetting siloxane polymer (B-4).

Resin Solution Preparation Example 8

To a solution of 100 parts of a polydimethylsiloxane containing 12 mol % vinyl at both ends and side chains, endcapped with $SiMe_2Vi$, and having a Mn of 50,000 in 400 parts of isododecane, 20 parts (2 moles per mole of alkenyl groups) of an organohydrogenpolysiloxane of the above formula (M-6) was added and mixed. The mixture was filtered through a membrane filter with a pore size of 0.2 μm, obtaining a solution of the thermosetting siloxane polymer (B-5).

Resin Solution Preparation Example 9

To a solution of 100 parts of a polydimethylsiloxane containing 5 mol % vinyl at both ends and side chains, endcapped with $SiMe_2Vi$, and having a Mn of 80,000 in 300 parts of isododecane, 13 parts (3 moles per mole of alkenyl groups) of an organohydrogenpolysiloxane of the above formula (M-6) was added and mixed. The mixture was filtered through a membrane filter with a pore size of 0.2 μm, obtaining a solution of the thermosetting siloxane polymer (B-6).

Resin Synthesis Example 1

A flask equipped with a stirrer, thermometer, nitrogen purge line and reflux condenser was charged with 43.1 g of 9,9'-bis(3-allyl-4-hydroxyphenyl)fluorene (M-1), 29.5 g of organohydrogensiloxane having the average structural formula (M-3), 135 g of toluene, and 0.04 g of chloroplatinic acid and heated at 80° C. Then, 17.5 g of 1,4-bis(dimethylsilyl)benzene (M-5) was added dropwise to the flask over one hour while the flask internal temperature rose to 85° C. At the end of dropwise addition, the reaction solution was aged at 80° C. for 2 hours. Toluene was distilled off, and instead, 80 g of cyclohexanone was added, obtaining a resin solution in cyclohexanone having a resin solid concentration of 50 wt %. The molecular weight of the resin in the solution was determined by GPC, finding a Mw of 45,000. To 50 g of the resin solution were added 7.5 g of an epoxy compound (EOCN-1020 by Nippon Kayaku Co., Ltd.) as crosslinker, 0.2 g of bis(t-butylsulfonyl)diazomethane (BSDM by Wako Pure Chemical Industries, Ltd.) as curing catalyst, and 0.1 g of tetrakis[methylene-(3,5-di-t-butyl-4-hydroxyhydrocinnamate)]-methane (ADK STAB AO-60) as antioxidant. Filtration through a membrane filter with a pore size of 1 μm yielded a resin solution (C-1).

Resin Synthesis Example 2

In a 5-L flask equipped with a stirrer, thermometer, nitrogen purge line and reflux condenser, 84.1 g of epoxy compound (M-2) was dissolved in 600 g of toluene. Then 294.6 g of compound (M-3) and 25.5 g of compound (M-4) were added to the flask, which was heated at 60° C. Then 1 g of platinum-on-carbon catalyst (5 wt %) was added. It was seen that the internal temperature rose to 65-67° C. Thereafter, the flask was further heated at 90° C., held at the temperature for 3 hours, and cooled to room temperature. To the reaction solution was added 600 g of methyl isobutyl ketone (MIBK). The reaction solution was passed through a filter under pressure to remove the platinum catalyst. Once the solvent was distilled off in vacuum from the resin solution, 270 g of propylene glycol monomethyl ether acetate (PGMEA) was added to the residue to form a resin solution in PGMEA having a solid concentration of 60 wt %. The molecular weight of the resin in the solution was determined by GPC, finding a Mw of 28,000. To 100 g of the resin solution were added 9 g of tetrafunctional phenol compound (TEP-TPA by Asahi Organic Chemical Industry Co., Ltd.) and 0.2 g of tetrahydrophthalic anhydride (Rikacid HH-A by New Japan Chemical Co., Ltd.). Filtration through a membrane filter with a pore size of 1 μm yielded a resin solution (C-2).

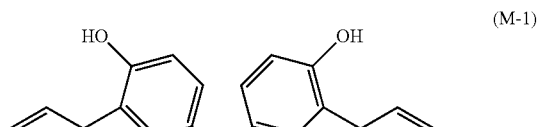

(M-1)

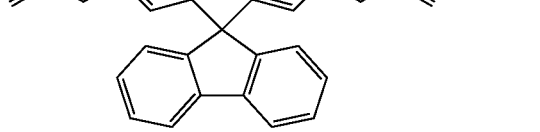

(M-2)

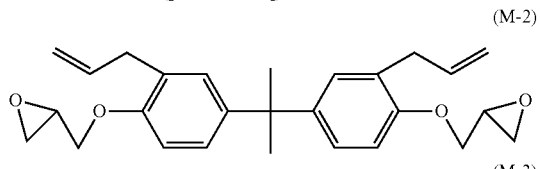

(M-3)

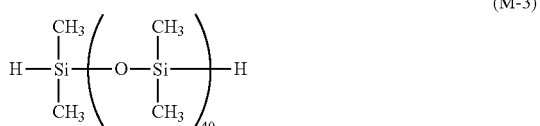

(M-4)

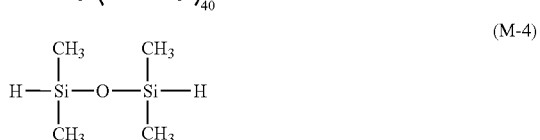

(M-5)

Comparative Solution Preparation Example 1

Thermoplastic resin SEPTON 4033 (hydrogenated styrene-isoprene-butadiene copolymer by Kuraray Co., Ltd, Tg ~25° C.), 24 g, was dissolved in 176 g of isononane to form a 12 wt % isononane solution of SEPTON 4033. The solution was filtered through a membrane filter with a pore size of 0.2 μm, obtaining an isononane solution of the thermoplastic resin (A-4).

Comparative Solution Preparation Example 2

Thermoplastic resin SEPTON 4033 (hydrogenated styrene-isoprene-butadiene copolymer by Kuraray Co., Ltd, Tg ~25° C.), 24 g, was dissolved in 176 g of isononane to form a 12 wt % isononane solution of SEPTON 4033. To 100 parts of the thermoplastic resin was added 2 parts of a platinum catalyst (CAT-PL-5 by Shin-Etsu Chemical Co., Ltd.). The solution was filtered through a membrane filter with a pore size of 0.2 μm, obtaining an isononane solution of the thermoplastic resin (A-5).

Comparative Solution Preparation Example 3

To a solution of 100 parts of a polydimethylsiloxane containing 3 mol % vinyl at both ends and side chains, endcapped with $SiMe_2Vi$, and having a Mn of 50,000 in 400 parts of isododecane, 8 parts (3 moles per mole of alkenyl groups) of an organohydrogenpolysiloxane of the above formula (M-6), and 0.7 part of ethynylcyclohexanol were added and mixed. To the mixture, 0.5 part (per 100 parts of the polydimethylsiloxane) of a platinum catalyst (CAT-PL-5 by Shin-Etsu Chemical Co., Ltd.) was added. The mixture was filtered through a membrane filter with a pore size of 0.2 μm, obtaining a solution of the thermosetting siloxane polymer (B-9).

Comparative Resin Synthesis Example 1

In a four-necked flask, 90 parts of a gum-like dimethylpolysiloxane of the following formula (7), capped with hydroxyl at both ends, having a viscosity at 25° C. of 98,000 mPa·s as measured in a 30% toluene solution, and 10 parts of a methylpolysiloxane resin consisting of $Me_3SiO_{0.5}$ units and $SiO_2$ units in a molar ratio $Me_3SiO_{0.5}/SiO_2$ of 0.75/1, with a hydroxyl content of 1.0 mol % per 100 parts of solids were dissolved in 900 parts of toluene. To the solution, 1 part of 28 wt % aqueous ammonia was added and stirred for 24 hours at room temperature for condensation reaction. The solution was heated at 180° C. in vacuum to distill off toluene, water of condensation and ammonia, yielding a solidified partial condensate. The partial condensate, 100 parts, was dissolved in 900 parts of toluene. To this solution, 20 parts of hexamethyldisilazane was added and stirred for 3 hours at 130° C. to cap the remaining hydroxyl groups. The solution was heated at 180° C. in vacuum to distill off the solvent and the like, yielding a solidified unreactive partial condensate. The unreactive partial condensate, 100 parts, was dissolved in 900 parts of hexane and added to 2,000 parts of acetone. The precipitated resin was collected, and hexane and other solvents were removed in vacuum, yielding a dimethylpolysiloxane polymer having a Mw of 900,000 and containing 0.05 wt % of a low molecular fraction having a molecular weight of up to 740. The dimethylpolysiloxane polymer, 20 g, was dissolved in 80 g of isododecane. The solution was filtered through a membrane filter with a pore size of 0.2 μm, obtaining an isododecane solution of the dimethylpolysiloxane polymer (B-8).

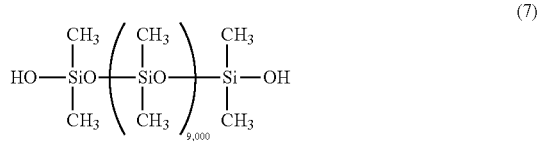

(7)

Example 1

The wafer used herein was a silicon wafer (diameter 200 mm, thickness 725 μm) having copper posts (diameter 40 μm, height 40 μm) distributed over its entire surface. Resin solution (A-1) was spin coated to the wafer and heated on a hot plate at 150° C. for 5 minutes to form a layer (A) having a thickness shown in Table 1 on the bump-bearing surface of the wafer. The support used herein was a glass plate (diameter 200 mm, thickness 500 pin). First polymer solution (C-1) was spin coated to the support and heated on a hot plate at 150° C. for 5 minutes to form a layer (C) having a thickness shown in Table 1 on the glass support. Thereafter, the thermosetting siloxane polymer solution (B-1) was spin coated to the layer (C) on the glass support and heated on a hot plate at 150° C. for 3 minutes to form a layer (B) having a thickness shown in Table 1 on layer (C). Using a vacuum wafer bonder, the silicon wafer having thermoplastic resin layer (A) was joined to the glass plate having thermosetting polymer layer (C) and thermosetting siloxane polymer layer (B) on layer (C), with their resin layers mated together, under the bonding conditions shown in Table 1. A wafer processing laminate was obtained in this way. The laminate was heated at 120° C. for 1 minute to bond the layers and then in an oven at 180° C. for 1 hour to cure layers (B) and (C), obtaining a laminate sample.

Examples 2 to 8 and Comparative Examples 1 to 4

Laminate samples were prepared by the same procedure as in Example 1 under the conditions shown in Table 1.

It is noted that although a glass plate is used herein as the support so that the laminate may be visually inspected for defects, a silicon wafer or substrate which is not transmissive to light may also be used.

Each laminate sample was examined by the following tests. The results of Examples and Comparative Examples are shown in Table 1. The tests were carried out in the following order. If a sample failed in a back surface grinding test (judged "X"), the subsequent test was no longer performed.

Adhesion Test

Using a wafer bonder EVG520IS of EV Group, the wafer with a diameter of 200 mm was bonded to the support under conditions including a bonding temperature as shown in Table 1, a chamber internal pressure of less than $10^{-3}$ mbar, and a load of 5 kN. After bonding, the laminate was heated in an oven at 180° C. for 1 hour for curing layers (B) and (C). After cooling to room temperature, the interfacial bond state between layers (A) and (B) was visually observed. The sample was evaluated good (○) when no defectives like bubbles were found at the interface, and poor (X) when defectives were found.

Back Surface Grinding Test

The back surface of the silicon wafer of the laminate (which had been heat cured in an oven at 180° C. for 1 hour) was ground by a grinder DAG810 of DISCO Co., Ltd. having a diamond abrasive wheel. After the wafer was ground to a final thickness of 50 μm, it was observed for defectives such as cracks and dislodgment under an optical microscope (100×). The sample was evaluated good (○) when no defectives were found, fair (Δ) when some defectives were found, but acceptable for the subsequent process, and poor (X) when defectives were found over the entire surface.

CVD Resistance Test

After the silicon wafer had been ground, the laminate was placed in a CVD apparatus where a $SiO_2$ film was deposited to a thickness of 2 μm. The outer appearance of the laminate was observed for anomaly. The sample was evaluated good (○) when no appearance anomalies were found, fair (Δ) when appearance anomalies such as void formation and wafer bulging were found on a portion of the wafer, but acceptable for the subsequent process, and poor (X) when appearance anomalies such as void formation, wafer bulging and wafer rupture were found over the entire surface. CVD resistance test was performed under the following conditions.

Apparatus: Plasma CVD PD-270STL (SAMCO, Inc.)
RF 500W, Inner pressure 40 Pa,
TEOS (tetraethyl orthosilicate):$O_2$=20:680 sccm Peel Test The wafer release ability was evaluated. Following the CVD resistance test, a dicing tape was applied to the surface of the wafer which had been thinned to 50 μm, using a dicing frame. The dicing tape was set to the chuck platen by vacuum chucking. At room temperature, the glass plate was peeled by pulling it up at one point using a pair of tweezers. The sample was evaluated good (○) when the glass plate was peeled without breakage of the 50-μm wafer, poor (X) when fissure or other anomalies occurred, and fair (Δ) when the glass plate could be peeled only after the pretreatment of immersing in isononane for 5 minutes.

Peel Interface

In the peel test, the peel interface is expressed by a combination of the temporary bond layers which are left on the wafer and support sides of the sample after peeling. For example, the peel interface A/B indicates that layer (A) is left on the wafer side and layer (B) on the support side.

Clean-Up Test

After the peel test, the 200-mm wafer (which had been exposed to the heat resistance test conditions) mounted on the dicing frame via the dicing tape was set on a spin coater, with the first temporary bond layer upside. Isononane as cleaning fluid was sprayed over the wafer for 3 minutes. Rinsing was then performed by spraying isopropyl alcohol (IPA) while spinning the wafer. The outer appearance of the wafer was visually observed for any residual adhesive resin. The sample was evaluated good (○) in the absence of residual resin and poor (X) in the presence of residual resin.

Peeling Force

The wafer used herein was a silicon wafer (diameter 200 mm, thickness 725 μm). A thermoplastic resin solution for layer (A) was spin coated to the wafer and heated on a hot plate at 150° C. for 3 minutes to form a layer (A) having a thickness shown in Table 1 on the bump-bearing surface of the wafer. The support used herein was a silicon wafer (diameter 200 mm, thickness 725 μm) which had been surface treated with a parting agent. First the thermosetting polymer solution for layer (C) was spin coated to the support and heated on a hot plate at 150° C. for 5 minutes to form a layer (C) having a thickness shown in Table 1 on the support or silicon wafer. Thereafter, the thermosetting siloxane polymer solution for layer (B) was spin coated and heated on a hot plate at 150° C. for 3 minutes to form a layer (B) having a thickness shown in Table 1 on the layer (C) on the support. Using a vacuum wafer bonder, the silicon wafer having layer (A) was joined to the silicon wafer having layers (C) and (B), with their resin layers mated together, under the bonding conditions shown in Table 1. A wafer processing laminate was obtained in this way. The laminate was heated in an oven at 180° C. for 1 hour for curing, after which the silicon wafer support was removed from the cured laminate, obtaining a layered structure composed of the silicon wafer and layers (A), (B) and (C), stacked in order.

Thereafter, five strips of polyimide tape of 150 mm long and 25 mm wide were attached to layer (C), and the temporary adhesive layer in the open regions between the tape strips was removed. Using AUTOGRAPH AG-1 (Shimadzu Corp.), the tape strip was peeled back in a 25° C. atmosphere at an angle of 1800 and at a rate of 300 mm/min over a stroke of 120 mm from its one end. An average of forces required to peel (120 mm stroke, 5 strips) was computed and reported as release force of layers (A/B).

TABLE 1

|  | Example | | | | | | | | Comparative Example | | | |
| --- | --- | --- | --- | --- | --- | --- | --- | --- | --- | --- | --- | --- |
|  | 1 | 2 | 3 | 4 | 5 | 6 | 7 | 8 | 1 | 2 | 3 | 4 |
| Resin layer (A) | A-1 | A-1 | A-1 | A-2 | A-3 | A-1 | A-1 | A-2 | A-3 | A-1 | A-3 | A-5 |
| Layer (A) thickness (μm) | 10 | 10 | 10 | 15 | 10 | 10 | 10 | 15 | 10 | 10 | 10 | 10 |
| Polymer layer (B) | B-1 | B-2 | B-3 | B-1 | B-1 | B-4 | B-5 | B-6 | B-1 | B-8 | B-9 | B-1 |
| Layer (B) thickness (μm) | 5 | 10 | 8 | 5 | 5 | 5 | 3 | 25 | 5 | 10 | 5 | 5 |
| Polymer layer (C) | C-1 | C-1 | C-2 | C-1 | C-2 | C-2 | C-1 | C-1 | C-1 | C-1 | C-1 | C-1 |
| Layer (C) thickness (μm) | 60 | 60 | 50 | 60 | 50 | 50 | 60 | 60 | 60 | 60 | 60 | 60 |
| Bonding temp. (° C.) | 120 | 120 | 140 | 120 | 140 | 140 | 120 | 120 | 120 | 120 | 120 | 120 |
| Bonding time (min) | 1 | 1 | 3 | 1 | 3 | 3 | 1 | 1 | 1 | 1 | 1 | 1 |
| Curing temp. (° C.) | 180 | 180 | 180 | 180 | 180 | 180 | 180 | 180 | 180 | 180 | 180 | 180 |
| Curing time (hr) | 1 | 1 | 1 | 1 | 1 | 1 | 1 | 1 | 1 | 1 | 1 | 1 |
| Peeling force (gf) | 5 | 12 | 20 | 5 | 5 | 10 | 40 | 7 | 8 | 10 | 8 | 8 |
| Adhesion | ○ | ○ | ○ | ○ | ○ | ○ | ○ | ○ | ○ | ○ | X | ○ |
| Resistance to back surface grinding | ○ | ○ | ○ | ○ | Δ | ○ | ○ | Δ | Δ | Δ | X | ○ |
| CVD resistance | ○ | ○ | ○ | ○ | Δ | ○ | ○ | Δ | X | X | — | ○ |
| Peel test | ○ | ○ | ○ | ○ | ○ | ○ | Δ | ○ | — | — | — | Δ |
| Peel interface | A/B | A/B | A/B | A/B | A/B | A/B | A/B | A/B | — | — | — | A/B |
| Clean-up test | ○ | ○ | ○ | Δ | ○ | ○ | ○ | ○ | — | — | — | X |

As seen from Table 1, Examples 1 to 8 within the scope of the invention provide a secure temporary bond and easy peel and are improved in CVD resistance and clean-up. In contrast, Comparative Example 1 having a layer (A) which was outside the scope of the invention was degraded in CVD resistance, and Comparative Example 3 having a layer (B) containing component (A-2) showed poor adhesion.

While the invention has been illustrated and described in typical embodiments, it is not intended to be limited to the details shown, since various modifications and substitutions can be made without departing in any way from the spirit of the present invention. As such, further modifications and equivalents of the invention herein disclosed may occur to persons skilled in the art using no more than routine experimentation, and all such modifications and equivalents are believed to be within the spirit and scope of the invention as defined by the following claims.

Japanese Patent Application No. 2015-131064 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. An arrangement for temporarily bonding a wafer to a support for wafer processing, the wafer having a circuit-forming front surface and a back surface to be processed, said temporary bonding arrangement being a composite temporary adhesive layer comprising a first temporary bond layer (A) of thermoplastic resin, a second temporary bond layer (B) of thermosetting siloxane polymer which is laid contiguous to the first temporary bond layer, and a third temporary bond layer (C) of thermosetting polymer which is laid contiguous to the second temporary bond layer, wherein the first temporary bond layer (A) is a resin layer of a composition comprising (A-1) 100 parts by weight of a thermoplastic resin and (A-2) an amount of a curing catalyst to provide more than 0 part to 1 part by weight of an active ingredient per 100 parts by weight of component (A-1), and the thermosetting siloxane polymer layer (B) is cured with the aid of the curing catalyst in the layer (A) which is contiguous to the layer (B).

2. The temporary bonding arrangement of claim 1 wherein the wafer is a substrate having steps of 10 to 80 μm high on its surface.

3. The temporary bonding arrangement of claim 1 wherein component (A-2) is a platinum-based catalyst.

4. The temporary bonding arrangement of claim 1 wherein the second temporary bond layer (B) is a polymer layer of a composition comprising (B-1) 100 parts by weight of an organopolysiloxane having an alkenyl group in the molecule and (B-2) an organohydrogenpolysiloxane having at least two silicon-bonded hydrogen atoms (i.e., SiH groups) per molecule in an amount to give a molar ratio of SiH group in component (B-2) to alkenyl group in component (B-1) of 0.3/1 to 15/1, which is cured with the aid of the curing catalyst in the layer (A) which is contiguous to the layer (B).

5. The temporary bonding arrangement of claim 1 wherein the third temporary bond layer (C) is a polymer layer of a composition comprising 100 parts by weight of a siloxane bond-containing polymer comprising recurring units of the general formula (1) and having a weight average molecular weight of 3,000 to 500,000, and 0.1 to 50 parts by weight of a crosslinker which is selected from the group consisting of an amino condensate, melamine resin and urea resin modified with formaldehyde or formaldehyde-alcohol, a phenol compound having on average at least two methylol or alkoxymethylol groups per molecule, and an epoxy compound having on average at least two epoxy groups per molecule,

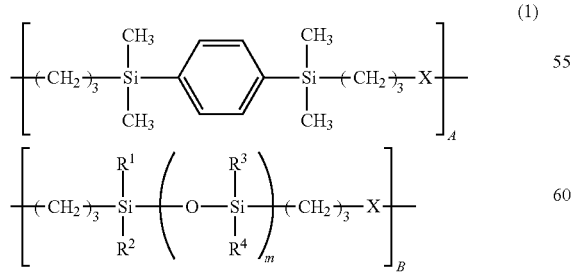

wherein $R^1$ to $R^4$ are each independently a monovalent hydrocarbon group of 1 to 8 carbon atoms, m is an integer of 1 to 100, B is a positive number, A is 0 or a positive number, A+B=1, X is a divalent organic group having the general formula (2) or 1,3-divinyltetramethyldisiloxane, with a divalent organic group having formula (2) being essentially contained,

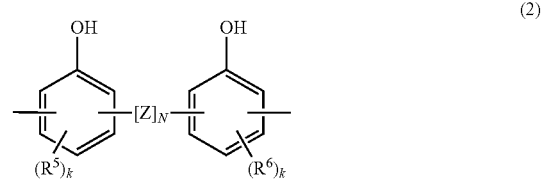

wherein Z is a divalent organic group selected from the following:

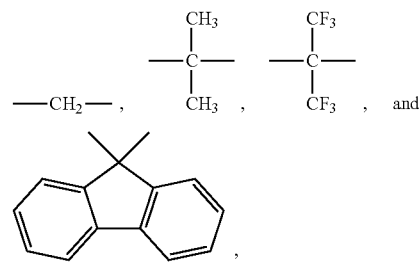

N is 0 or 1, $R^5$ and $R^6$ are each independently an alkyl or alkoxy group of 1 to 4 carbon atoms, and k is 0, 1 or 2.

6. The temporary bonding arrangement of claim 1 wherein the third temporary bond layer (C) is a polymer layer of a composition comprising 100 parts by weight of a siloxane bond-containing polymer comprising recurring units of the general formula (3) and having a weight average molecular weight of 3,000 to 500,000, and 0.1 to 50 parts by weight of a crosslinker which is selected from the group consisting of a phenol compound having on average at least two phenol groups per molecule and an epoxy compound having on average at least two epoxy groups per molecule,

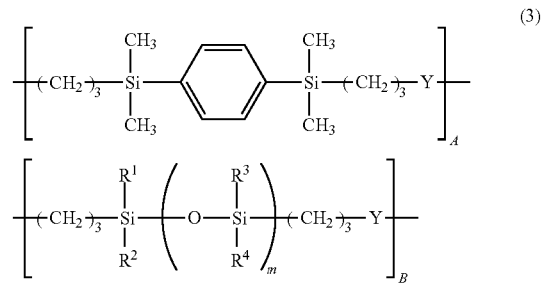

wherein $R^1$ to $R^4$ are each independently a monovalent hydrocarbon group of 1 to 8 carbon atoms, m is an integer of 1 to 100, B is a positive number, A is 0 or a positive number, A+B=1, Y is a divalent organic group having the general formula (4) or 1,3-divinyltetramethyldisiloxane, with a divalent organic group having formula (4) being essentially contained,

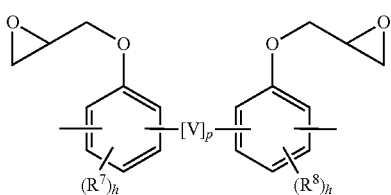

wherein V is a divalent organic group selected from the following:

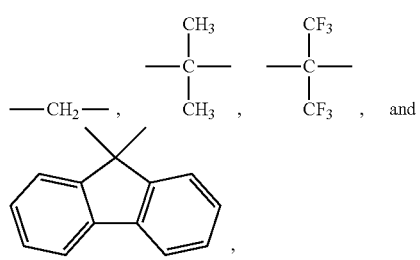

p is 0 or 1, $R^7$ and $R^8$ are each independently an alkyl or alkoxy group of 1 to 4 carbon atoms, and h is 0, 1 or 2.

7. A wafer processing laminate comprising a support, a temporary adhesive layer on the support, and a wafer laid contiguous to the temporary adhesive layer, the wafer having a circuit-forming front surface and a back surface to be processed,
said temporary adhesive layer being a composite temporary adhesive layer comprising a first temporary bond layer (A) of thermoplastic resin, a second temporary bond layer (B) of thermosetting siloxane polymer which is laid contiguous to the first temporary bond layer, and a third temporary bond layer (C) of thermosetting polymer which is laid contiguous to the second temporary bond layer,
wherein the first temporary bond layer (A) is a resin layer of a composition comprising (A-1) 100 parts by weight of a thermoplastic resin and (A-2) an amount of a curing catalyst to provide more than 0 part to 1 part by weight of an active ingredient per 100 parts by weight of component (A-1), and the thermosetting siloxane polymer layer (B) is cured with the aid of the curing catalyst in the layer (A) which is contiguous to the layer (B).

8. The wafer processing laminate of claim 7 wherein component (A-2) is a platinum-based catalyst.

9. The wafer processing laminate of claim 7 wherein the second temporary bond layer (B) is a polymer layer of a composition comprising (B-1) 100 parts by weight of an organopolysiloxane having an alkenyl group in the molecule and (B-2) an organohydrogenpolysiloxane having at least two silicon-bonded hydrogen atoms (i.e., SiH groups) per molecule in an amount to give a molar ratio of SiH group in component (B-2) to alkenyl group in component (B-1) of 0.3/1 to 15/1, which is cured with the aid of the curing catalyst in the layer (A) which is contiguous to the layer (B).

10. The wafer processing laminate of claim 7 wherein the third temporary bond layer (C) is a polymer layer of a composition comprising 100 parts by weight of a siloxane bond-containing polymer comprising recurring units of the general formula (1) and having a weight average molecular weight of 3,000 to 500,000, and 0.1 to 50 parts by weight of a crosslinker which is selected from the group consisting of an amino condensate, melamine resin and urea resin modified with formaldehyde or formaldehyde-alcohol, a phenol compound having on average at least two methylol or alkoxymethylol groups per molecule, and an epoxy compound having on average at least two epoxy groups per molecule,

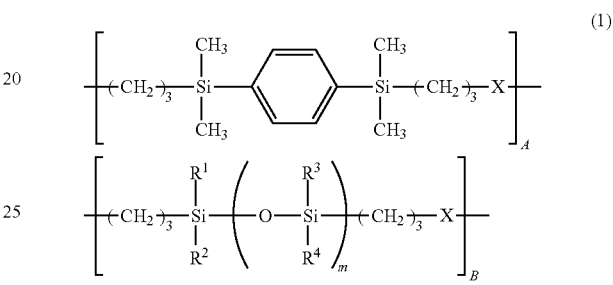

wherein $R^1$ to $R^4$ are each independently a monovalent hydrocarbon group of 1 to 8 carbon atoms, m is an integer of 1 to 100, B is a positive number, A is 0 or a positive number, A+B=1, X is a divalent organic group having the general formula (2) or 1,3-divinyltetramethyldisiloxane, with a divalent organic group having formula (2) being essentially contained,

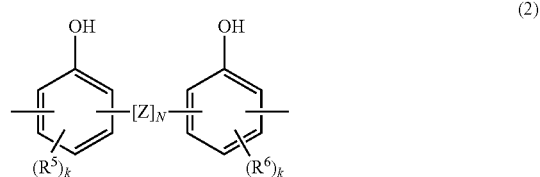

wherein Z is a divalent organic group selected from the following:

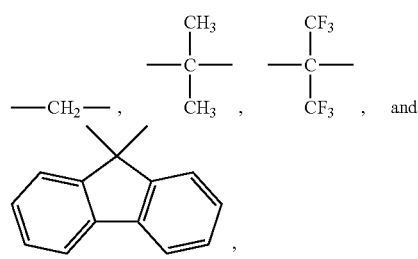

N is 0 or 1, $R^5$ and $R^6$ are each independently an alkyl or alkoxy group of 1 to 4 carbon atoms, and k is 0, 1 or 2.

11. The wafer processing laminate of claim 7 wherein the third temporary bond layer (C) is a polymer layer of a composition comprising 100 parts by weight of a siloxane bond-containing polymer comprising recurring units of the general formula (3) and having a weight average molecular weight of 3,000 to 500,000, and 0.1 to 50 parts by weight of a crosslinker which is selected from the group consisting of a phenol compound having on average at least two phenol groups per molecule and an epoxy compound having on average at least two epoxy groups per molecule,

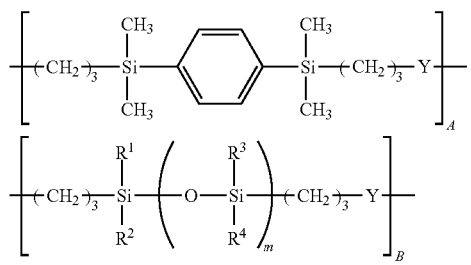
(3)

wherein $R^1$ to $R^4$ are each independently a monovalent hydrocarbon group of 1 to 8 carbon atoms, m is an integer of 1 to 100, B is a positive number, A is 0 or a positive number, A+B=1, Y is a divalent organic group having the general formula (4) or 1,3-divinyltetramethyldisiloxane, with a divalent organic group having formula (4) being essentially contained,

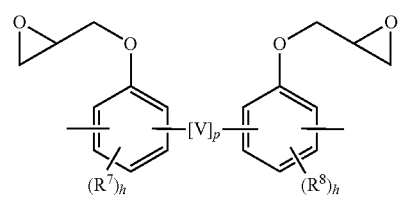
(4)

wherein V is a divalent organic group selected from the following:

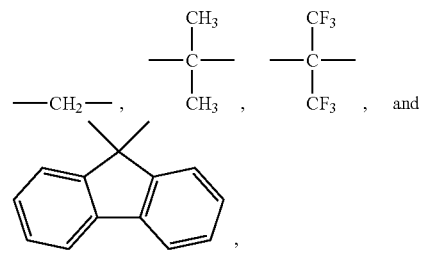

p is 0 or 1, $R^7$ and $R^8$ are each independently an alkyl or alkoxy group of 1 to 4 carbon atoms, and h is 0, 1 or 2.

* * * * *